(12) United States Patent
Kagami

(10) Patent No.: US 7,504,828 B2
(45) Date of Patent: Mar. 17, 2009

(54) FREQUENCY SYNTHESIZER FOR RF PULSES, MRI APPARATUS AND RF PULSE GENERATING METHOD

(75) Inventor: Shigeru Kagami, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/954,369

(22) Filed: Dec. 12, 2007

(65) Prior Publication Data

US 2008/0143334 A1 Jun. 19, 2008

(30) Foreign Application Priority Data

Dec. 13, 2006 (JP) ............... 2006-336398

(51) Int. Cl.
*G01V 3/00* (2006.01)
(52) U.S. Cl. ..................... 324/322; 324/318
(58) Field of Classification Search ......... 324/300–322; 600/407–422
See application file for complete search history.

(56) References Cited

U.S. PATENT DOCUMENTS

| | | | |
|---|---|---|---|
| 5,436,600 A | 7/1995 | Van Heteren et al. | |
| 6,411,093 B2 * | 6/2002 | Schwilch et al. | 324/322 |
| 6,862,435 B2 | 3/2005 | Miyano et al. | |
| 7,106,064 B2 * | 9/2006 | Yoshizawa | 324/322 |
| 7,173,421 B2 * | 2/2007 | Hannah | 324/300 |
| 2003/0008626 A1 * | 1/2003 | Miyano et al. | 455/114 |

FOREIGN PATENT DOCUMENTS

| | | |
|---|---|---|
| JP | 09-108807 | 4/1997 |
| JP | 2001-104281 | 4/2001 |

OTHER PUBLICATIONS http://www.ednjapan.com/content/issue/2006/07/content04.html, "To improve high frequency characteristics of D/A converters: Mechanism of deterioration of high frequency characteristics and three possible remedies".

* cited by examiner

*Primary Examiner*—Brij B Shrivastav
(74) *Attorney, Agent, or Firm*—Armstrong Teasdale LLP

(57) ABSTRACT

A frequency synthesizer for RF pulses for RF coils used in MRI apparatuses, includes: a D/A converter which converts digital values of the waveform of a fundamental wave whose frequency is lower than a Nyquist frequency, which is half the sampling frequency, into an analog waveform; and a band-pass filter which passes only a prescribed alias out of an alias group whose frequency is higher than the Nyquist frequency, contained in said analog waveform, wherein: said prescribed alias having passed said band-pass filter is transmitted from said RF coil as an RF pulse.

20 Claims, 11 Drawing Sheets

$$\text{Bandwidth} = \frac{1}{\text{Period}}$$

(Sinc pulse)
Center of RF pulse
t=∅

Period = 2 msec          BW = 500 Hz

Period = 1 msec          BW = 1000 Hz

Time region             Frequency region (a)

(b)

(c)

(a)

(b)

FREQUENCY SYNTHESIZER FOR RF PULSES, MRI APPARATUS AND RF PULSE GENERATING METHOD

CROSS REFERENCE TO RELATED APPLICATIONS

This application claims the benefit of Japanese Patent Application No. 2006-336398 filed Dec. 13, 2006.

BACKGROUND OF THE INVENTION

The field of the present invention relates to a frequency synthesizer for RF pulses, an MRI apparatus and an RF pulse generating method. In more detail, it relates to a frequency synthesizer for RF pulses, an MRI apparatus and an RF pulse generating method permitting high speed switching-over of the frequency of the RF pulse under a high magnetostatic intensity.

An MRI apparatus is an apparatus that generates magnetic resonance signals by utilizing the magnetic resonance phenomenon, and thereby obtains tomograms of slices of the subject. An MRI apparatus selects the slice to be imaged by transmitting an RF pulse of a resonance frequency proportional to the magnetic field intensity of the slicing position. For an MRI apparatus, it is desirable to permit high speed changing of the slicing position to reduce the time taken to pick up an image, and accurate and quick switching-over of the frequency of the RF pulse is required.

Therefore, MRI apparatuses use a direct digital synthesizer (hereinafter abbreviated to DDS) to generate RF pulses (see, for instance, paragraph [0003] of Patent Document 1, FIG. 2). FIG. 10 is a block diagram showing the configuration of a conventional DDS 40. The DDS 40 is configured of a phase storage unit 41, a phase accumulator unit 42, a waveform table 43, a D/A converter 314 and a low-pass filter 44.

Phase increments are stored in the phase storage unit 41. Phase increments are inputted to the phase accumulator unit 42, and added to the accumulated phase in every clock period. The clock period here is the reciprocal of the sampling frequency fs. The accumulated phase is outputted from the phase accumulator unit 42, and the accumulated phase is inputted to the waveform table 43. The waveform table 43 is formed of, for instance, a ROM, and stores waveform values corresponding to accumulated phases. An accumulated phase is inputted to an address in the ROM, and a digital value of a waveform stored in the corresponding address is outputted from the ROM. The digital value of the waveform is inputted to the D/A converter 314, and converted into an analog waveform. Incidentally, signals from the phase storage unit 41 to the input of the D/A converter 314 are digital signals, and those from the output of the D/A converter 314 onward are analog signals.

FIG. 11 is a diagram showing the waveform of an analog signal outputted from the D/A converter when the digital value of a sine waveform is stored in the waveform table. As the output waveform of the D/A converter 314 is sampled in each clock period, it is stepwise as viewed in a time region and an alias signal (hereinafter it is referred to as alias in this specification, the scope of claims and drawings) is included, as viewed in terms of the frequency region. When the frequency of the input signal of the D/A converter 314 is fo, the alias appears in the frequency of n×fs±fo (n is a natural number). The alias is removed by the low-pass filter 44, and the analog waveform of the frequency fo is outputted from the DDS 40. Since the DDS 40 has no feedback loop such as a PLL (Phase Locked Loop), it can switch over the frequency at high speed.

FIG. 12 is a diagram showing the output of the D/A converter expressed in terms of the frequency region. When the frequency of the input signal of the D/A converter 314 is fo, the frequency of the first alias is fs−fo, and the frequencies of the second and third aliases are fs+fo and 2fs−fo, respectively. The output of the D/A converter 314, as viewed in terms of the frequency region, is attenuated along the slice of the sinc function of the next equation by the aperture effect (see, for instance, Non-Patent Document 1).

$$\operatorname{sinc}\left(\frac{\pi f}{fs}\right) = \frac{\sin\left(\frac{\pi f}{fs}\right)}{\frac{\pi f}{fs}} \qquad [\text{Formula 1}]$$

The frequency fs/2, which is half the sampling frequency fs, is referred to as the Nyquist frequency. The range in which the attenuation of kept within −0.1 dB by the aperture effect is only up to the frequency of about 0.17 times the Nyquist frequency. As shown in FIG. 12, the magnitude of the output of the D/A converter 314 approaches zero in the vicinity of fs and in the vicinity of 2fs.

To cancel the influence of this aperture effect, a method that uses a pre-equalization filter whose frequency response is an inverse sinc function is proposed (see, for instance, Non-Patent Document 1). The inverse sinc function is a function represented by 1/sinc(x). By inputting signals increased in the amplitude of the high region by applying this pre-equalization filter to the D/A converter 314, the influence of the aperture effect can be cancelled.

FIG. 13 is a block diagram showing the configuration of a DDS that outputs aliases contained in the output of the D/A converter. A DDS 50 differs from the DDS 40 of FIG. 10 in that it uses a band-pass filter 315 instead of the low-pass filter 44. The phase storage unit 41, the phase accumulator unit 42, the waveform table 43 and the D/A converter 314 are common elements between the DDS 50 and the DDS 40. The band-pass filter 315 passes only specific aliases contained in the output of the D/A converter 314 (see, for instance, Patent Document 2). Even if the sampling frequency of the D/A converter 314 is low, an analog waveform output of a high frequency can be obtained.

Patent Document 1. Japanese Unexamined Patent Publication No. 2001-104281.

Patent Document 2 Japanese Unexamined Patent Publication No. Sho 63 (1988)-108807.

Non-Patent Document 1. http://www.ednjapan.com/content/issue/2006/07/content04.html, "To improve high frequency characteristics of D/A converters: Mechanism of deterioration of high frequency characteristics and three possible remedies".

As increasing the intensity of the magnetostatic field provides a high S/N ratio, the resolution improvement of picked-up images and the shortening of the time taken to pick up images are thereby made possible. In recent years, the magnetic field intensities of MRI apparatuses have been increasingly enhanced, and a 3 T (tesla) ultra-high magnetic field MRI apparatus has been developed. In this 3 T ultra-high magnetic field MRI apparatus, the frequency of the RF pulses is as high as 128 MHz.

In order to generate RF pulses of a 128 MHz frequency required by the 3 T ultra-high magnetic field MRI apparatus by using a DDS 40 used for conventional MRI apparatuses, a D/A converter operating at a speed faster than twice 128 MHz is required. Furthermore in the farther future, the intensity of the magnetostatic field may reach or even surpass 4.7 T. In that case, much faster D/A converter would be needed. The operating speeds of the phase accumulator unit 42 and the waveform table 43 will also become faster, resulting increased power consumption.

Ultra-high frequency signals can be generated by using a PLL (Phase Locked Loop). However, as a PLL has a feedback loop, it involves difficulty in high speed switching-over of the frequency, and therefore cannot be considered most suitable for the generation of RF pulses.

SUMMARY OF THE INVENTION

Therefore, an object of the invention is to make possible generation of high frequency RF pulses with a low speed D/A converter, and to provide a frequency synthesizer for RF pulses, an MRI apparatus and an RF pulse generating method permitting high speed switching-over of the frequency of the RF pulse even under a high magnetostatic intensity.

In an aspect of the invention, a frequency synthesizer for RF pulses according to the invention is a frequency synthesizer for RF pulses for RF coils used in MRI apparatuses, having a D/A converter which converts digital values of the waveform of a fundamental wave whose frequency is lower than a Nyquist frequency, which is half the sampling frequency, into an analog waveform; and a band-pass filter which passes only a prescribed alias out of an alias group whose frequency is higher than the Nyquist frequency, contained in the analog waveform, wherein the prescribed alias having passed the band-pass filter is transmitted from the RF coil as an RF pulse.

Preferably, the frequency synthesizer for RF pulses according to the invention should have an envelope shape generating unit which generates a prescribed envelope shape; an envelope shape correcting unit which corrects the envelope shape with the value of a sinc function in the frequency of the RF pulse; and an inverse Fourier transform unit which subjects the corrected envelope shape to inverse Fourier transform and outputs the digital value of the waveform of the fundamental wave.

Preferably in the frequency synthesizer for RF pulses according to the invention, the center frequency of the RF pulse should be a frequency resulting from the subtraction of the center frequency of the fundamental wave from a frequency resulting from the multiplication of the sampling frequency by n (n is a natural number); and the envelope shape should be identical with a shape resulting from a reversal between the low frequency side and the high frequency side of the RF pulse.

Preferably in the frequency synthesizer for RF pulses according to the invention, the center frequency of the RF pulse should be a frequency resulting from the addition of the center frequency of the fundamental wave to a frequency resulting from the multiplication of the sampling frequency by n (n is a natural number); and the envelope shape is identical with the shape of the RF pulse.

An MRI apparatus according to the invention has a frequency synthesizer for RF pulses which generates RF pulses, and an RF coil for transmitting the RF pulses, wherein the frequency synthesizer for RF pulses comprises a D/A converter which converts digital values of the waveform of a fundamental wave whose frequency is lower than a Nyquist frequency, which is half the sampling frequency, into an analog waveform; and a band-pass filter which passes only a prescribed alias out of an alias group whose frequency is higher than the Nyquist frequency, contained in the analog waveform, wherein the prescribed alias having passed the band-pass filter is transmitted from the RF coil as the RF pulse.

Preferably in the MRI apparatus according to the invention, the frequency synthesizer for RF pulses should have an envelope shape generating unit which generates a prescribed envelope shape; an envelope shape correcting unit which corrects said envelope shape with the value of a sinc function in the frequency of said RF pulse; and an inverse Fourier transform unit which subjects the corrected envelope shape to inverse Fourier transform and outputs the digital value of the waveform of said fundamental wave.

Preferably in the MRI apparatus according to the invention, the center frequency of the RF pulse should be a frequency resulting from the subtraction of the center frequency of the fundamental wave from a frequency resulting from the multiplication of the sampling frequency by n (n is a natural number); and the envelope shape should be identical with a shape resulting from a reversal between the low frequency side and the high frequency side of the RF pulse.

Preferably in the MRI apparatus according to the invention, the center frequency of the RF pulse should be a frequency resulting from the addition of the center frequency of the fundamental wave to a frequency resulting from the multiplication of the sampling frequency by n (n is a natural number); and the envelope shape should be identical with the shape of the RF pulse.

An RF pulse generating method for RF coils used in MRI apparatuses according to the invention, has a step at which a D/A converter converts digital values of the waveform of a fundamental wave whose frequency is lower than a Nyquist frequency, which is half the sampling frequency, into an analog waveform; and a step at which a band-pass filter passes only a prescribed alias out of an alias group whose frequency is higher than the Nyquist frequency, contained in the analog waveform, wherein the prescribed alias having passed the band-pass filter is transmitted from the RF coil as an RF pulse.

Preferably the RF pulse generating method according to the invention should have an envelope shape generating step of generating a prescribed envelope shape; an envelope shape correcting step of correcting the envelope shape with the value of a sinc function in the frequency of the RF pulse; and an inverse Fourier transform step of subjecting the corrected envelope shape to inverse Fourier transform and outputting the digital value of the waveform of the fundamental wave.

Preferably in the RF pulse generating method according to the invention, the center frequency of the RF pulse should be a frequency resulting from the subtraction of the center frequency of the fundamental wave from a frequency resulting from the multiplication of the sampling frequency by n (n is a natural number); and the envelope shape should be identical with a shape resulting from a reversal between the low frequency side and the high frequency side of the RF pulse.

Preferably in the RF pulse generating method according to the invention, the center frequency of the RF pulse should be a frequency resulting from the addition of the center frequency of the fundamental wave to a frequency resulting from the multiplication of the sampling frequency by n (n is a natural number); and the envelope shape should be identical with the shape of the RF pulse.

According to the invention, it is made possible to generate high frequency RF pulses with a low speed D/A converter, and to provide a frequency synthesizer for RF pulses, an MRI apparatus and an RF pulse generating method permitting high speed switching-over of the frequency of the RF pulse even under a high magnetostatic intensity.

Further objects and advantages of the present invention will be apparent from the following description of the preferred embodiments of the invention as illustrated in the accompanying drawings.

DETAILED DESCRIPTION OF THE INVENTION

Figure 1:
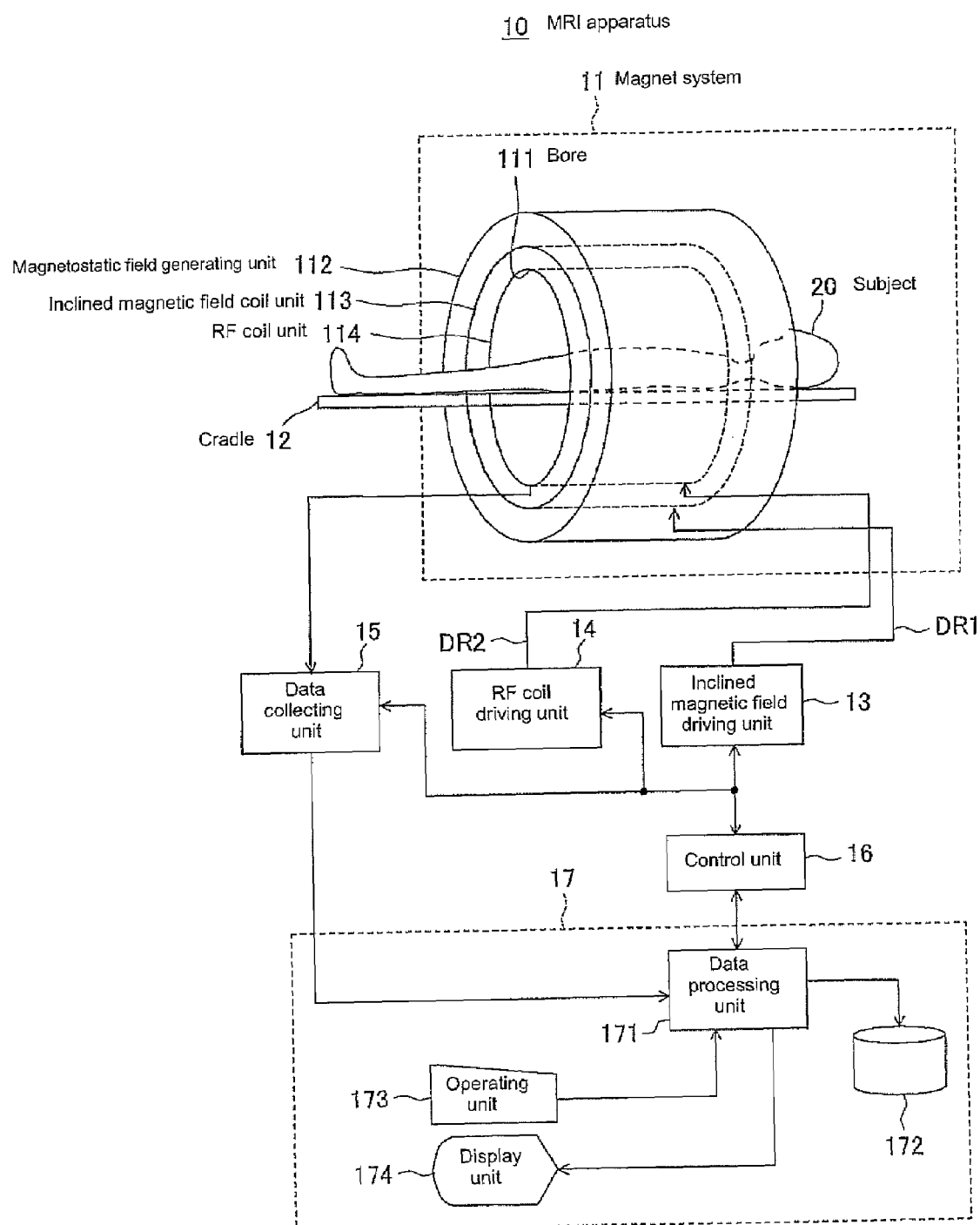
FIG. 1 is a diagram showing an MRI apparatus in one mode for carrying out the invention.

FIG. 1 is a diagram showing an MRI apparatus in one mode for carrying out the invention. An MRI apparatus 10 in one mode for carrying out the invention, as shown in FIG. 1, has a magnet system 11, a cradle 12, an inclined magnetic field driving unit 13, an RF coil driving unit 14, a data collecting unit 15, a control unit 16 and an operator console 17.

The magnet system 11, as shown in FIG. 1, has a substantially columnar internal space (bore) 111, and the cradle 12 mounted with a subject 20 with a cushion in-between is carried into the bore 111 by a carrying means not shown.

Within the magnet system 11, as shown in FIG. 1, a magnetostatic field generating unit 112, an inclined magnetic field coil unit 113 and an RF coil unit 114 are arranged around a magnet center (the central position of scanning) in the bore 111.

The magnetostatic field generating unit 112 forms a magnetostatic field within the bore 111. The direction of the magnetostatic field is, for instance, parallel to the direction of the body axis of the subject 20. The direction of the magnetostatic field may as well be normal to the direction of the body axis of the subject 20, though.

The inclined magnetic field coil unit 113 generates, for the purpose providing three-dimensional positional information to magnetic resonance signals formed by the RF coil unit 114, inclined magnetic fields which give a gradient to the intensity of the magnetostatic field received by the magnetostatic field generating unit 112. The inclined magnetic fields generated by the inclined magnetic field coil unit 113 are of three kinds including a slice selecting inclined magnetic field, a frequency encode inclined magnetic field and a phase encode inclined magnetic field, and the inclined magnetic field coil unit 113 has three lines of inclined magnetic field coils matching these three kinds of inclined magnetic fields.

The RF coil unit 114 transmits RF pulses, and causes magnetic signals to be generated by exciting in the magnetostatic field space formed by the magnetostatic field generating unit 112 spins within the body of the subject 20. The RF coil unit 114 also receives magnetic signals issued from the subject 20. Incidentally, the RF coil unit 114 may have either a configuration in which an RF coil for transmission and an RF coil for reception use are separately provided or a configuration in which the communication of RF pulses and the reception of magnetic resonance signals are accomplished by a common RF coil.

The inclined magnetic field driving unit 13 causes an inclined magnetic field to be generated by giving a driving signal DR1 to the inclined magnetic field coil unit 113 in accordance with an instruction from the control unit 16. The inclined magnetic field driving unit 13 has three lines of driving circuits, not shown, matching the three lines of inclined magnetic field coils of the inclined magnetic field coil unit 113.

The RF coil driving unit 14, having a frequency synthesizer for RF pulses to be described afterwards, and generates a driving signal DR2 by using the frequency synthesizer for RF pulses. The driving signal DR2 is given to the RF coil unit 114, and RF pulses are transmitted in accordance with the driving signal DR2.

The data collecting unit 15 captures magnetic resonance signals received by the RF coil unit 114, converts them into digital signals, and outputs them to a data processing unit 171 of the operator console 17.

The control unit 16 controls the inclined magnetic field driving unit 13 and the RF coil driving unit 14 in accordance with a prescribed pulse sequence, and generates the driving signal DR1 and the driving signal DR2. Further, the control unit 16 controls the data collecting unit 15.

The operator console 17 has, as shown in FIG. 1, the data processing unit 171, an image database 172, an operating unit 173 and a display unit 174. The data processing unit 171 performs control, image reconstruction processing and the like of the whole MRI apparatus 10. The control unit 16 is connected to the data processing unit 171, and the data processing unit 171 supervises the control unit 16. Also, the image database 172, the operating unit 173 and the display unit 174 are connected to the data processing unit 171. The image database 172 is configured of, for instance, a disk device permitting recording and reproduction, and records data collected by the data collecting unit 15 and reconstructed image data. The operating unit 173 is configured of a keyboard, mouse and so forth, while the display unit 174 is configured of a graphic display or the like.

Figure 2:
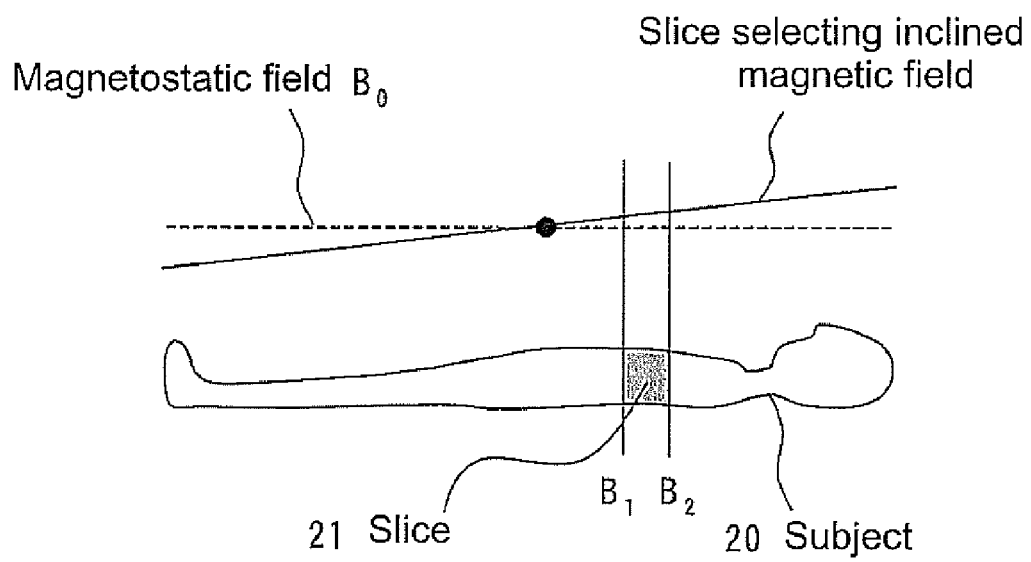
FIG. 2 is a diagram showing the relationship between a slice, which is an object of imaging, and magnetic fields.

FIG. 2 is a diagram showing the relationship between a slice, which is an object of imaging, and magnetic fields. RF pulses are transmitted in a state in which a magnetostatic field of intensity B0 and a slice selecting inclined magnetic field are applied to the subject 20. Magnetic fields of magnetic intensity $B_1$ to magnetic intensity $B_2$ are applied to a slice 21. For this reason, the frequency of the RF pulses has a frequency band matching magnetic field intensities of magnetic intensity $B_1$ to magnetic intensity $B_2$. Viewed in terms of the frequency region, the shape of the RF pulses is square, with its intensity usually constant in the frequency range matching the slice 21 and falling to 0 outside that range. However, in some cases the RF pulses may have some other shape than square, depending on the object of imaging. When the position of the slice to be imaged is changed, the frequency of the RF pulses is altered.

Incidentally, in this specification and the scope of claims, the shape of RF pulses will be referred to as the waveform of RF pulses in the time region, and the shape of RF pulses in the frequency range will be referred to as the shape of RF pulses.

Figure 3:
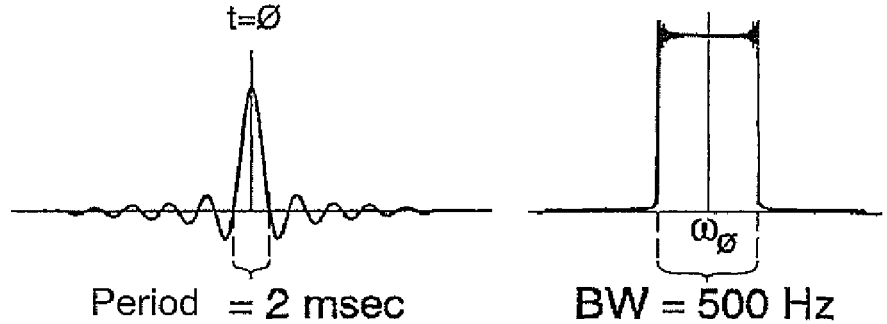
FIG. 3 is a diagram showing an example each of the waveform of an RF pulse in the time region and the shape of an RF pulse in the frequency region.
Figure 3:
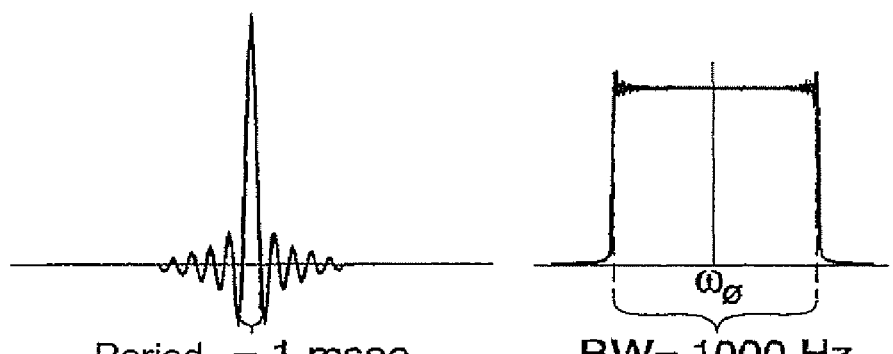

FIG. 3 is a diagram showing an example each of the waveform of an RF pulse in the time region and the shape of an RF pulse in the frequency region. When the shape of the RF pulse in the frequency region is square, the waveform of the RF pulse in the time region is a sinc pulse. The sinc pulse is defined by the function sinc (x)=sin (x)/x presented as Formula 1 above, and ideally has an infinite length. The frequency bandwidth of the RF pulse is figured out as the reciprocal of the length of one period of the sinc pulse. For instance, when the RF pulse is a sinc pulse having a period of 2 msec in the time region, it has a frequency bandwidth of 500 Hz in the frequency region, or when the RF pulse is a sinc pulse having a period of 1 msec in the time region, it has a frequency bandwidth of 1000 Hz in the frequency region. However, since it is impossible to generate an infinitely long sinc pulse, actually it is cut at a sufficient long period for practical purposes.

The RF pulse, as viewed in the time region, is generated by multiplying the sine wave or cosine wave (hereinafter referred to as the sine wave or the like) of a frequency $\omega\phi$ by a sinc pulse. This operation is matched in the frequency region by shifting of the center frequency of the square pulse from 0 Hz to the frequency $\omega\phi$. The center frequency $\omega\phi$ of the RF pulse is determined by the frequency $\omega\phi$ of the sine wave or the like, and the frequency bandwidth of the RF pulse and the waveform of the RF pulse are determined by the sinc pulse. When the position of the slice is to be changed, the frequency $\omega\phi$ of the sine wave or the like is altered according to the magnetic field intensity of the position to be changed.

Incidentally, the RF pulse can be some other shape than square. This case, in order to determine the waveform of the RF pulse, multiplication by sinc pulse is carried out. In this connection, the waveform by multiplication is carried out to determine the waveform of the RF pulse will referred to as the envelope waveform, and the shape of the envelope waveform in the frequency region will be referred to as the envelope shape in this specification, the scope of claims and drawings.

Figure 4:
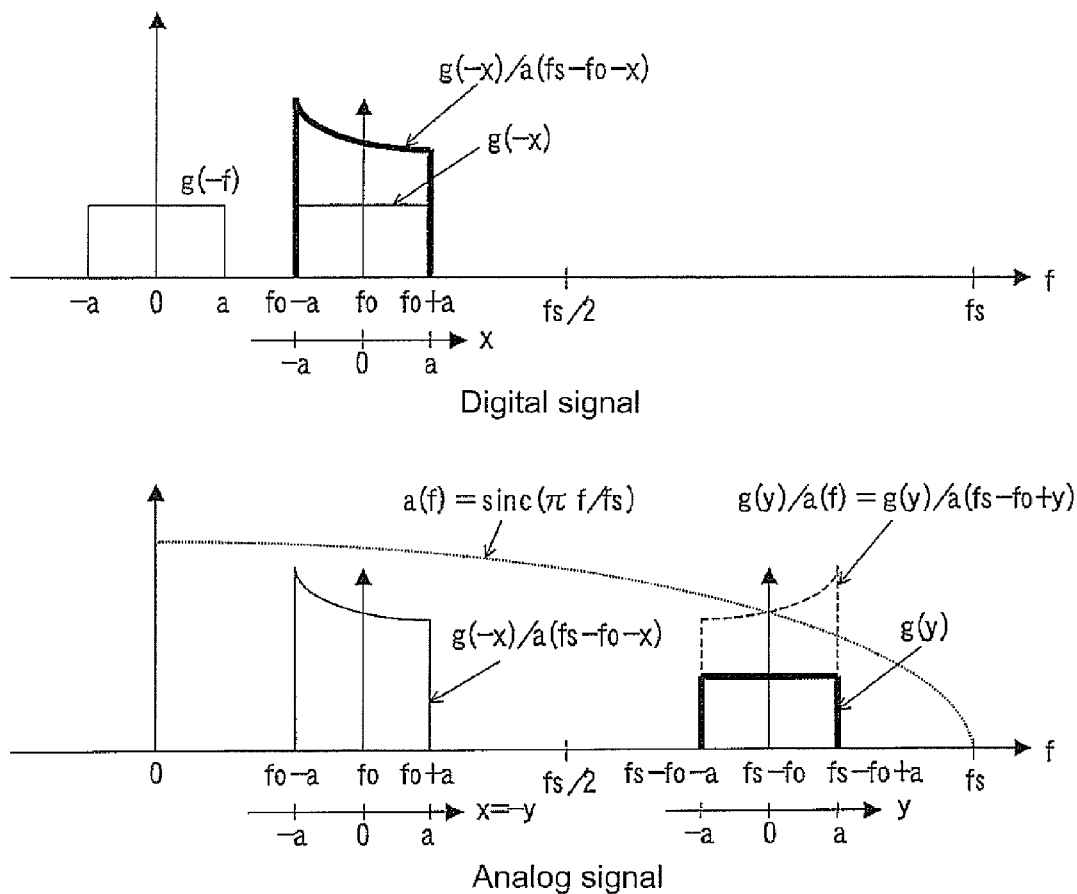
FIG. 4 is a diagram showing an RF pulse generating method in the one mode for carrying out the invention.

FIG. 4 is a diagram showing an RF pulse generating method in the one mode for carrying out the invention. A frequency fs is the sampling frequency of the D/A converter. Further, a frequency fo is the center frequency of the fundamental wave inputted to the D/A converter, and is a lower frequency than the Nyquist frequency fs/2, which is half the sampling frequency fs. In this mode for implementing the invention, when a digital signal is converted into an analog signal by the D/A converter, an RF pulse g(y) is generated from an alias occurring on the center frequency fs−fo.

In this mode for implementation, it is anticipated that the shape of the alias is reversed between the low frequency side and the high frequency side of the shape of the digital signal inputted to the D/A converter and that the shape of the alias is distorted by the aperture effect.

In FIG. 4, g(−f) is an envelope shape, the center frequency is 0 Hz, the minimum of the frequency is −a and the maximum of the same is a. The envelope shape g(−f) is reversed between the low frequency side and the high frequency side of the shape of the RF pulse g(y), and the shape of the RF pulse is determined by the envelope shape g(−f).

First, the center frequency of the envelope shape g(−f) is shifted to fo. The shifted shape is represented by g(−x). g(−x) is fo in center frequency, fo−a in minimum frequency and fo+a in maximum frequency. To consider here with regard to g(−x) a coordinate system x in which the center frequency is 0 Hz, the minimum frequency is −a and the maximum is a, so that the shape itself of g(−x) is the same as the envelope shape g(−f).

Next, to cancel the waveform distortion due to the aperture effect, g(−x) is corrected with the sinc function a(f)=sinc($\pi$f/fs) presented as Formula 1 above. The alias occurring on the center frequency fs−fo is attenuated by the value of the sinc function a(f) compared with ideal digital to analog conversion. Therefore, correction to subtract the value of the sinc function a(f) at the frequency of the alias from g(−x) is performed. This correction may as well be accomplished by multiplying g(−x) by the inverse sinc function, namely the reciprocal 1/a(f) of the sinc function.

FIGS. 5(a), 5(b), and 5(c) are diagrams showing the method of correcting g(−x). FIG. 5(a) represents the shape of the RF pulse g(y) in a coordinate system 6 whose center coordinate is 0. Viewed as the coordinate system y, the RF pulse g(y) is a square whose minimum is −a and maximum is a, and the following formula holds between the frequencies f and y.

$$f=fs-fo+y \qquad \text{[Formula 2]}$$

FIG. 5(b) shows a method of canceling the influence of the aperture effect. By dividing the RF pulse g(y) by a(f), the shape for canceling the drop in gain due to the aperture effect can be figured out. The shape for canceling the influence of the aperture effect is represented by the following formula.

$$\frac{g(Y)}{a(f)} = \frac{g(y)}{a(fs-fo+y)} \qquad \text{[Formula 3]}$$

FIG. 5(c) shows a method of canceling the influence of the reversal of the waveform. By changing to the coordinate system x which is in a relationship of y=−x from the coordinate system y, a shape in which the influence of the reversal of the waveform is canceled can be figured out. The shape in which the influence of the reversal of the waveform is represented by the following formula.

$$\frac{g(-x)}{a(fs-fo-x)} \qquad \text{[Formula 4]}$$

Therefore, by correcting g(−x) with the foregoing formula and carrying out conversion from digital to analog, the shape of the RF pulse g(y) shown in FIG. 4 can be obtained.

However, what is inputted to the D/A converter is not the shape in the frequency region but the waveform in the time region. Therefore, the waveform of the time region is figured out by subjecting g(−x)/a(fs−fo−x) to inverse Fourier transform. More specifically, first the values of the envelope shape g(−f) and the sinc function a(f) or the inverse sinc function 1/a(f) are calculated and stored in advance. Next, the value of g(−x)/a)(fs−fo−x) is figured out by varying x from −a to a. Finally, inverse Fourier transform is carried out with note taken of the fact that the value of x=−a matches the frequency fo−a and the value of x=a matches the frequency fo+a.

Figure 5:
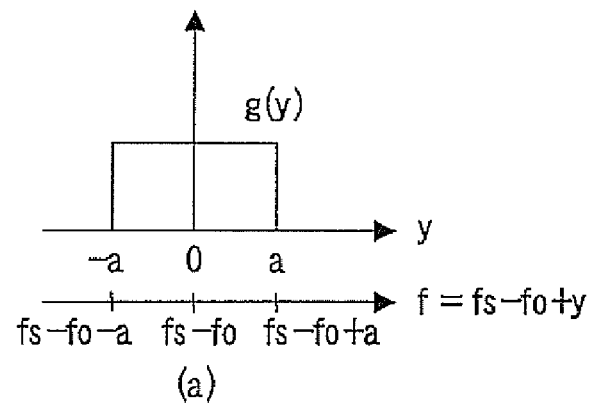
FIGS. 5(a), 5(b), and 5(c) are diagrams showing the method of correcting g(−x).
Figure 5:
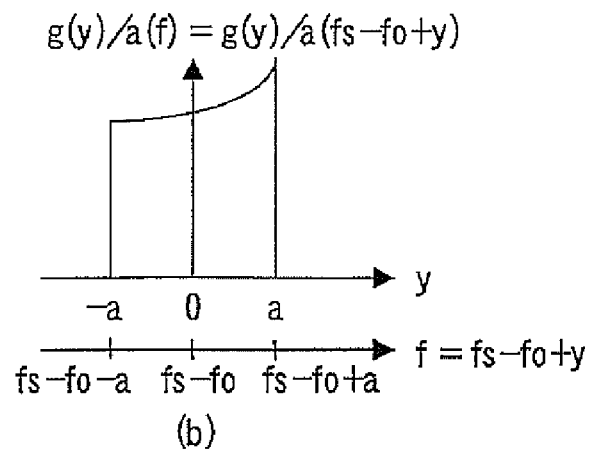
Figure 5:
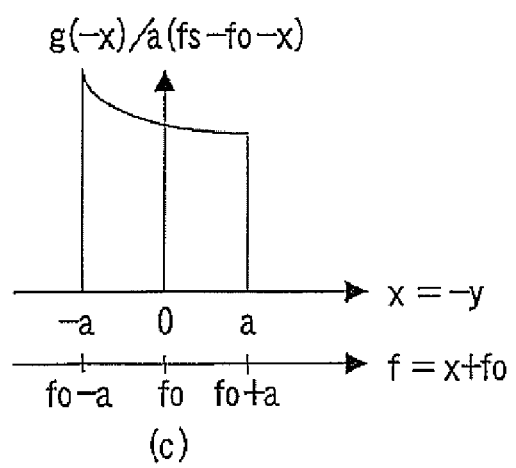

Incidentally, though FIG. 4 and FIG. 5 show a case in which the shape of the RF pulse g(y) is square, the shape of the RF pulse g(y) is not limited to square, but can be any desired one.

Figure 6:
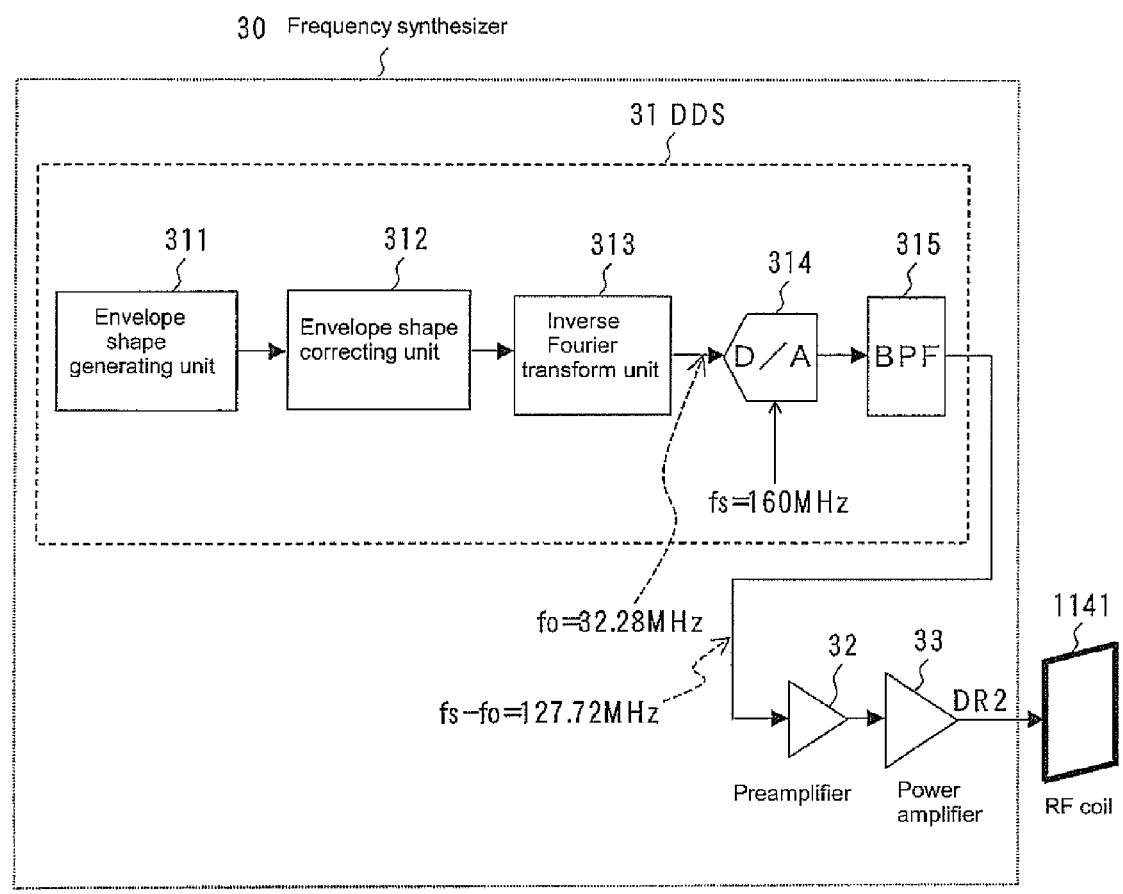
FIG. 6 is a block diagram showing the configuration of a frequency synthesizer in one mode for carrying out the invention.

FIG. 6 is a block diagram showing the configuration of a frequency synthesizer in one mode for carrying out the invention. A frequency synthesizer 30 has, as shown in FIG. 6, a DDS 31, a preamplifier 32 and a power amplifier 33. RF pulses are outputted from the DDS 31. The RF pulses are amplified by the preamplifier 32, and the output of the preamplifier 32 is further amplified by the power amplifier 33 to generate the driving signal DR2. The driving signal DR2 is provided to a transmission RF coil 1141 in the RF coil unit 114, and an RF pulse is transmitted from the transmission RF coil 1141 to the subject 20. Incidentally, the transmission RF coil 1141 may also serve as a reception coil.

The DDS 31 is composed of, as shown in FIG. 6, an envelope shape generating unit 311, an envelope shape correcting unit 312, an inverse Fourier transform unit 313, the D/A converter 314 and a band-pass filter 315. Signals from the envelope shape generating unit 311 to the D/A converter 314 are digital signals, and those from the out of the D/A converter 314 onward are analog signals.

The envelope shape generating unit 311, having a table in which the envelope shape g(−x) is stored, generates the envelope shape g(−x). The envelope shape g(−x) results from the reversal between the low frequency side and the high frequency side of the shape g(y) of the RF pulse. Incidentally, though the envelope shape is supposed to be g(−f) and the shape resulting from the shifting of the center frequency of the envelope shape g(−f) to fo is shown as g(−x) in FIG. 4, since g(−f) and g(−x) are the same in shape, the envelope shape g(−x) may also be supposed to be stored in the envelope shape generating unit 311. Further, the table in which the envelope shape g(−x) is stored is configured of, for instance, an ROM, a combined circuit, a RAM or the like.

The envelope shape correcting unit 312 corrects g(−x) with the sinc function a(f)=sinc(πf/fs). The inverse Fourier transform unit 313 subjects g(−x)/a(fs−fo−x) to inverse Fourier transform to figure out the waveform in the time region. The D/A converter 314 converts the waveform in the time region expressed in digital signals into analog signals at the sampling frequency fs. The band-pass filter 315 passes only the alias generated at the center frequency fs−fo, and attenuates other aliases and the fundamental wave of the center frequency fo. From the DDS 31, alias generated at the center frequency fs−fo is outputted as the RF pulse.

In the 3 T (tesla) ultra-high magnetic field MRI apparatus for instance, the resonance frequency matching the intensity 3.0 of the magnetostatic field is 127.72 MHz. In order to have this frequency outputted from the DDS 31, the fundamental wave of 32.28 MHz in center frequency can be inputted to the D/A converter 314, and the D/A converter 314 can be operated at the sampling frequency fs=160 MHz as shown in FIG. 6. The low-cut frequency and the high-cut frequency of the band-pass filter 315 being supposed to be 80 MHz and 160 MHz, an alias of 127.72 MHz in center frequency is passed. Incidentally, fo=32.28 MHz, fs=160 MHz, the low-cut frequency=80 MHz and the high-cut frequency=160 MHz are only exemplary, but obviously other frequencies can be used respectively.

Figure 7:
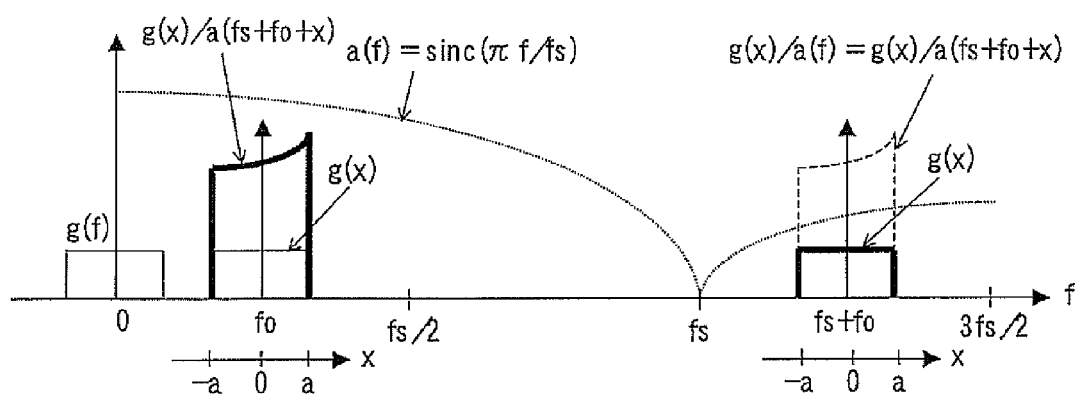
FIG. 7 is a diagram showing an RF pulse generating method in another mode for carrying out the invention.

FIG. 7 is a diagram showing an RF pulse generating method in another mode for carrying out the invention. In this mode for implementation, when the sampling frequency is fs and the center frequency of the fundamental wave is fo, an RF pulse is generated from an alias occurring at the frequency fs+fo. The alias occurring at the frequency fs+fo, unlike the alias of fs−fo, the shape of the alias and the shape of the fundamental wave are identical. There is no reversal between the low frequency side and the high frequency side compared with the shape of the fundamental wave. Only the correction of the waveform distortion due to the aperture effect needs to be considered.

More specifically, first the center frequency of the envelope shape g(f) is shifted to fo. The shifted shape is represented by g(x). g(x) is fo in center frequency, fo−a in minimum frequency, and fo+a in maximum frequency. To consider here the coordinate system x whose center frequency is 0 Hz with respect to g(x), the minimum frequency is −a, the maximum frequency is a, and the shape itself of g(x) is the same as the envelope shape g(f).

Next, to cancel the waveform distortion due to the aperture effect, correction is carried out by dividing g(x) by the value of the sinc function at the frequency of the alias. However, the correction can as well be carried out by multiplication of g(x) by the inverse sinc function, namely the reciprocal of the sinc function 1/a (f).

FIGS. 8(a) and 8(b) are diagrams showing the method of correcting g(x). FIG. 8(a) represents the shape of the RF pulse g(x) in the coordinate system x whose center coordinate is 0. As viewed in the coordinate system x, the RF pulse g(x) is a square of which the minimum value is −a and the maximum value is a, having the relationship of the following formula between the frequencies f and x.

$$f=fs+fo+x \quad \text{[Formula 5]}$$

FIG. 8(b) shows a method of canceling the influence of the aperture effect. By dividing the RF pulse g(x) by a(f), the shape for canceling the drop in gain due to the aperture effect can be figured out. The shape for canceling the influence of the aperture effect is represented by the following formula.

$$\frac{g(x)}{a(f)} = \frac{g(x)}{a(fs+fo+x)} \quad \text{[Formula 6]}$$

Therefore, by correcting g(x) with the foregoing formula and carrying out conversion from digital to analog, the shape of the RF pulse g(y) shown in FIG. 7 can be obtained.

However, what is inputted to the D/A converter is not the shape in the frequency region but the waveform in the time region. Therefore, the waveform of the time region is figured out by subjecting g(x)/a(fs+fo+x) to inverse Fourier transform. More specifically, first the values of the envelope shape g(f) and the sinc function a(f) or the inverse sinc function 1/a (f) are calculated and stored in advance. Next, the value of g(x)/a(fs+fo+x) is figured out by varying x from −a to a. Finally, inverse Fourier transform is carried out with note taken of the fact that the value of x=−a matches the frequency fo−a and the value of x=a matches the frequency fo+a.

Figure 8:
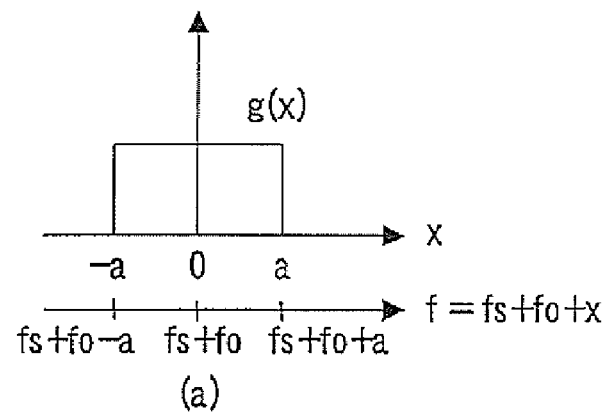
FIGS. 8(a) and 8(b) are diagrams showing the method of correcting g(x).
Figure 8:
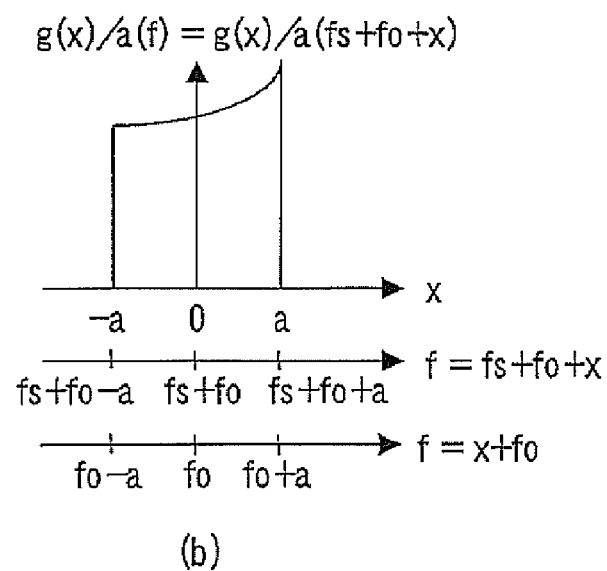

Incidentally, though FIG. 7 and FIG. 8 show a case in which the shape of the RF pulse g(y) is square, the shape of the RF pulse g(y) is not limited to square, but can be any desired one.

In this mode for implementation, too, the frequency synthesizer 30 shown in FIG. 6 can generate RF pulses. However, the envelope shape generating unit 311 stores the envelope shape g(x) and generates the envelope shape g(x). The envelope shape g(x) is the same as the shape g(y) of the RF pulse. Incidentally, though the envelope shape is supposed to be g(x) and a shape resulting from the shifting of the center frequency of the envelope shape g(f) to fo is supposed to be g(x) in FIG.

7, as g(f) and g(x) are the same in shape, it is also possible to suppose that the envelope shape g(x) is stored in the envelope shape generating unit 311.

The envelope shape correcting unit 312 corrects g(x) with the sinc function a(f)=sinc(πf/fs). The inverse Fourier transform unit 313 subjects g(x)/a(fs+fo+x) to inverse Fourier transform to figure out the waveform in the time region. The band-pass filter 315 passes only the alias generated at the center frequency fs+fo, and attenuates other aliases and the fundamental wave of the center frequency fo. From the DDS 31, alias generated at the center frequency fs+fo is outputted as the RF pulse.

The resonance frequency of the 4.7 T ultra-high magnetic field MRI apparatus, for instance, is 200 MHz. In order to cause the DDS 31 to output an RF pulse having this as the center frequency, a fundamental wave of fo=40 MHz can be inputted to the D/A converter 314 and the D/A converter 314 can be operated at the sampling frequency of fs=160 MHz. The low-cut frequency and the high-cut frequency of the band-pass filter 315 are set to 160 MHz and 240 MHz, respectively, to pass an alias whose center frequency is 200 MHz. Incidentally, fo=40 MHz, fs=160 MHz, the low-cut frequency=160 MHz and the high-cut frequency=240 MHz are only exemplary, but obviously other frequencies can be used respectively.

When the sampling frequency is fs and the frequency of the fundamental wave is fo, aliases will appear at frequencies of n×fs±fo (n is a natural number). Although the foregoing cites a case in which the frequency of aliases is fs±fo, the invention can also be applied to aliases of other frequencies to generate RF pulses.

Figure 9:
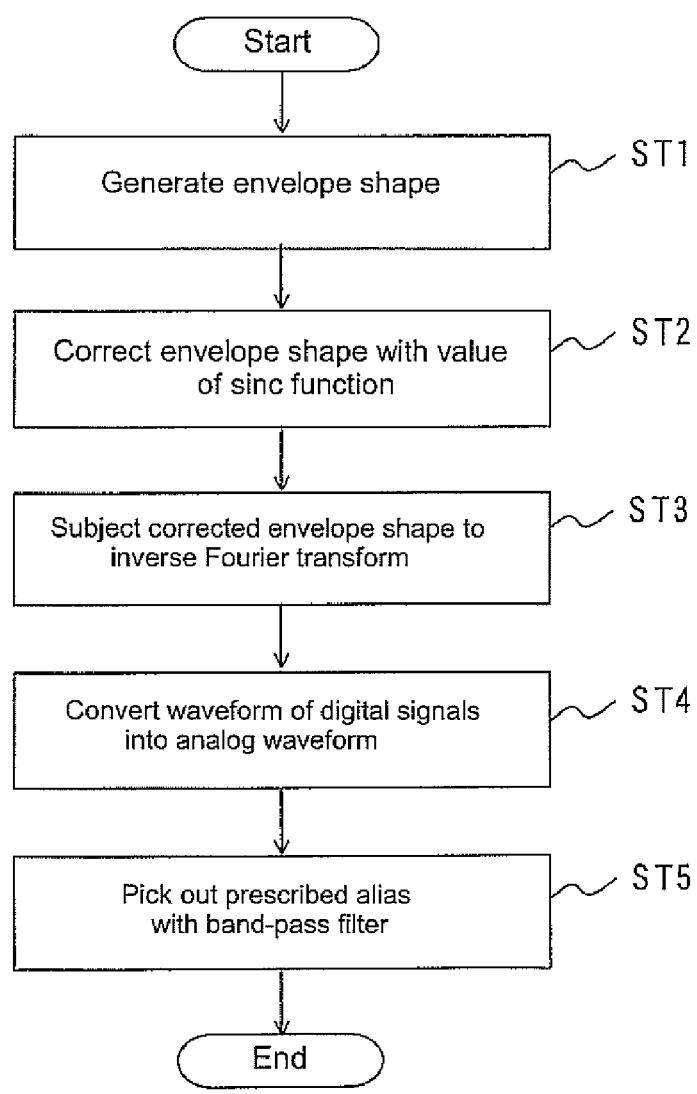
FIG. 9 is a chart showing the RF pulse generating method in one mode for implementing the invention.
Figure 10:
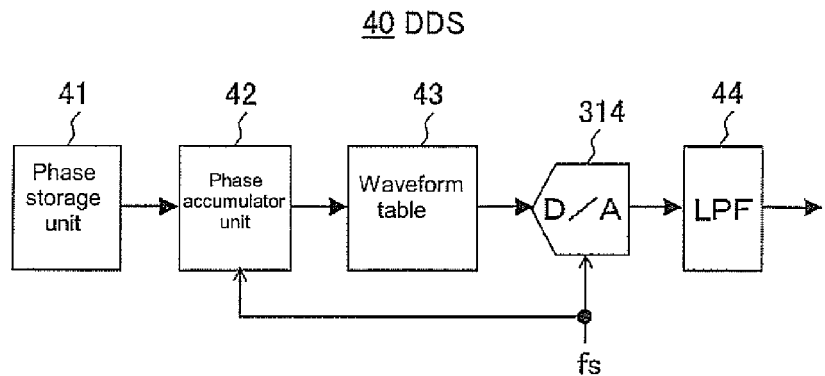
FIG. 10 is a block diagram showing the configuration of a known conventional DDS.
Figure 11:
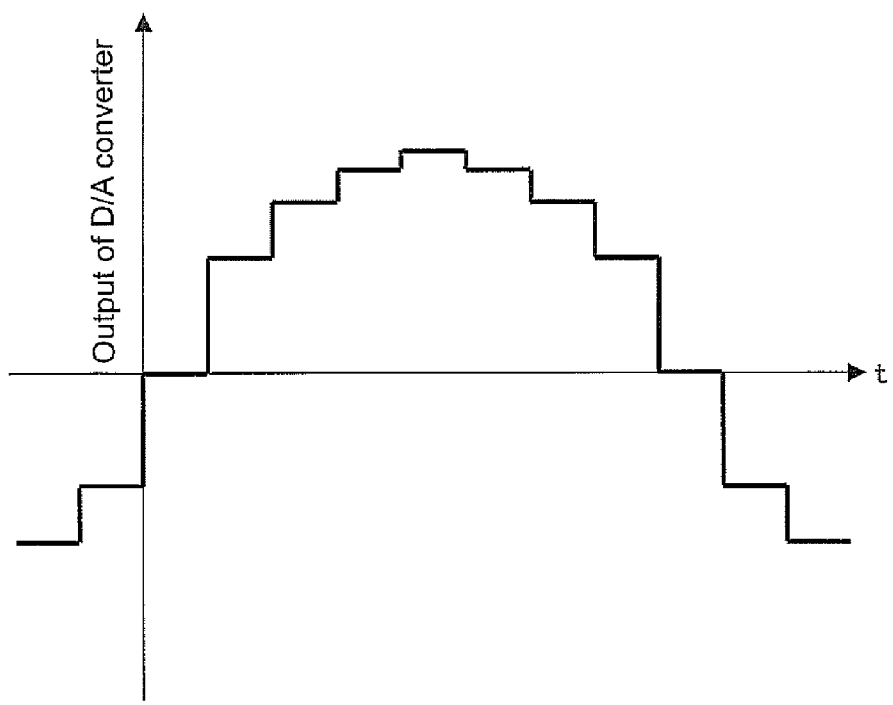
FIG. 11 is a diagram showing a known waveform of an analog signal outputted from the D/A converter when the digital value of a sine waveform is stored in the waveform table.
Figure 12:
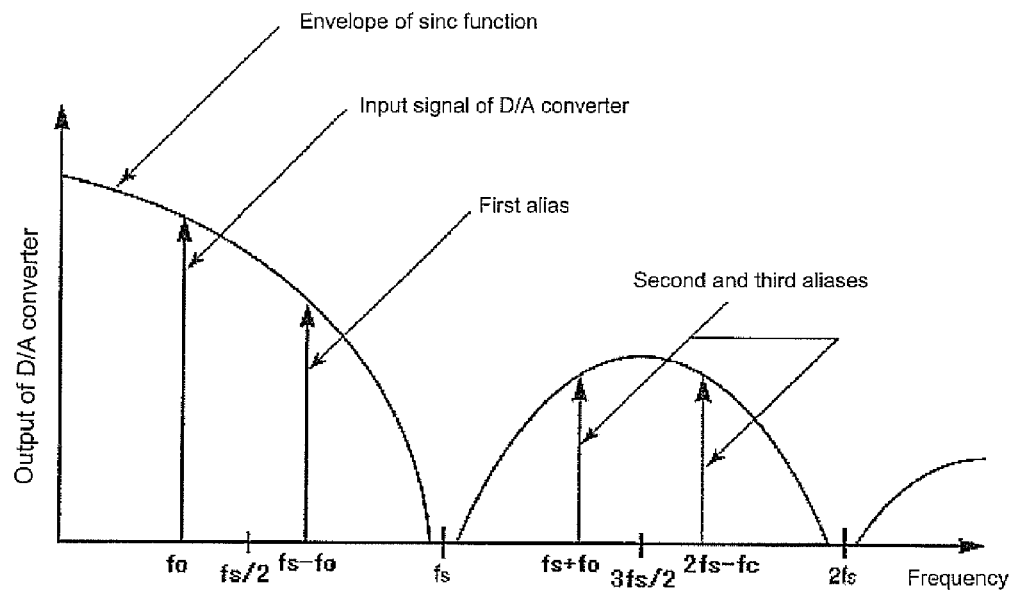
FIG. 12 is a diagram showing a known output of the D/A converter expressed in terms of the frequency region.
Figure 13:
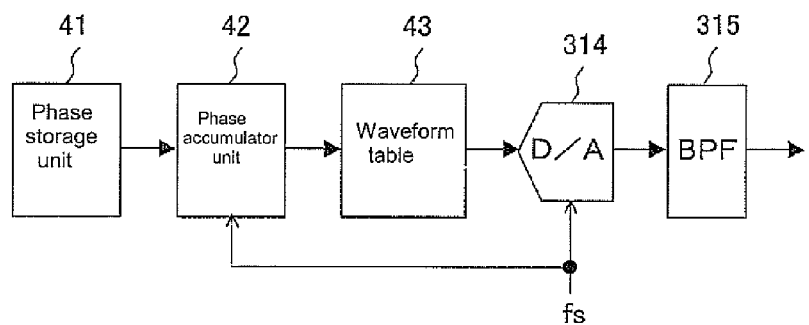
FIG. 13 is a block diagram showing the configuration of a known DDS that outputs aliases contained in the output of the D/A converter.

FIG. 9 is a chart showing the RF pulse generating method in one mode for implementing the invention. By this RF pulse generating method, the envelope shape in frequency region is stored in the table, and the envelope shape is generated by reading the envelope shape out of the table (step ST1). Next, the envelope shape is corrected with the value of the sinc function (step ST2). At step ST2, when the sampling frequency is fs and the center frequency of the fundamental wave is fo, it is anticipated that the shape of the alias of n×fs−fo (n is a natural number) is reversed between the low frequency side and the high frequency side of the envelope shape. And the corrected envelope shape is subjected to inverse Fourier transform to figure out the digital value of the waveform of the fundamental wave in the time region (step ST3). The digital value of the waveform of this fundamental wave is converted into an analog waveform by using the D/A converter (step ST4), and a prescribed alias is picked out of a plurality of aliases contained in the analog waveform by using the band-pass filter (step ST5). The picked-out prescribed alias is amplified, and transmitted from the RF coil as an RF pulse.

In the modes for implementation so far described, it is made possible to generate high frequency RF pulses by using a low speed D/A converter. Also an ultra-high speed MRI apparatus can be readily realized, which was difficult on account of the performance limitation of D/A converters.

Many widely different embodiments of the invention may be configured without departing from the spirit and the scope of the present invention. It should be understood that the present invention is not limited to the specific embodiments described in the specification, except as defined in the appended claims.

The invention claimed is:

1. A frequency synthesizer for RF pulses for RF coils used in MRI apparatuses, comprising:
a D/A converter which converts digital values of the waveform of a fundamental wave whose frequency is lower than a Nyquist frequency, which is half the sampling frequency, into an analog waveform; and
a band-pass filter which passes only a prescribed alias out of an alias group whose frequency is higher than the Nyquist frequency, contained in said analog waveform, wherein:
said prescribed alias having passed said band-pass filter is transmitted from said RF coil as an RF pulse.

2. The frequency synthesizer for RF pulses according to claim 1, comprising:
an envelope shape generating unit which generates a prescribed envelope shape;
an envelope shape correcting unit which corrects said envelope shape with the value of a sine function in the frequency of said RF pulse; and
an inverse Fourier transform unit which subjects the corrected envelope shape to inverse Fourier transform and outputs the digital value of the waveform of said fundamental wave.

3. The frequency synthesizer for RF pulses according to claim 2, wherein:
the center frequency of said RF pulse is a frequency resulting from the subtraction of the center frequency of said fundamental wave from a frequency resulting from the multiplication of said sampling frequency by n (n is a natural number); and
said envelope shape is identical with a shape resulting from a reversal between the low frequency side and the high frequency side of the RF pulse.

4. The frequency synthesizer for RF pulses according to claim 2, wherein:
the center frequency of said RF pulse is a frequency resulting from the addition of the center frequency of said fundamental wave to a frequency resulting from the multiplication of said sampling frequency by n (n is a natural number); and
said envelope shape is identical with the shape of the RF pulse.

5. The frequency synthesizer for RF pulses according to claim 1, wherein the RF pulses facilitate generating an image with the MRI apparatus.

6. The frequency synthesizer for RF pulses according to claim 5, wherein the frequency synthesizer facilitates reducing an amount of time to generate the image with the MRI apparatus.

7. The frequency synthesizer for RF pulses according to claim 1, wherein the frequency synthesizer facilitates switching a frequency of the RF pulses under a high magnetostatic intensity.

8. An MRI apparatus comprising:
a frequency synthesizer for RF pulses which generates RF pulses; and
an RF coil for transmitting said RF pulses, wherein:
said frequency synthesizer for RF pulses comprises: a D/A converter which converts digital values of the waveform of a fundamental wave whose frequency is lower than a Nyquist frequency, which is half the sampling frequency, into an analog waveform; and a band-pass filter which passes only a prescribed alias out of an alias group whose frequency is higher than the Nyquist frequency, contained in the analog waveform, wherein:
said prescribed alias having passed said band-pass filter is transmitted from said RF coil as said RF pulse.

9. The MRI apparatus according to claim 8, wherein said frequency synthesizer for RF pulses includes:
an envelope shape generating unit which generates a prescribed envelope shape;

an envelope shape correcting unit which corrects said envelope shape with the value of a sinc function in the frequency of said RF pulse; and an inverse Fourier transform unit which subjects the corrected envelope shape to inverse Fourier transform and outputs the digital value of the waveform of said fundamental wave.

10. The MRI apparatus according to claim 9, wherein:

the center frequency of said RF pulse is a frequency resulting from the subtraction of the center frequency of said fundamental wave from a frequency resulting from the multiplication of said sampling frequency by n (n is a natural number); and said envelope shape is identical with a shape resulting from a reversal between the low frequency side and the high frequency side of the RF pulse.

11. The MRI apparatus according to claim 9, wherein:

the center frequency of said RF pulse is a frequency resulting from the addition of the center frequency of said fundamental wave to a frequency resulting from the multiplication of said sampling frequency by n (n is a natural number); and said envelope shape is identical with the shape of the RF pulse.

12. The MRI apparatus according to claim 8, wherein the MRI apparatus generates an image using the RF pulses.

13. The MRI apparatus according to claim 12, wherein the frequency synthesizer facilitates reducing an amount of time to generate the image with the MRI apparatus.

14. The MRI apparatus according to claim 8, wherein the frequency synthesizer facilitates switching a frequency of the RF pulses under a high magnetostatic intensity.

15. An RF pulse generating method for RF coils used in MRI apparatuses, comprising:

a step at which a D/A converter converts digital values of the waveform of a fundamental wave whose frequency is lower than a Nyquist frequency, which is half the sampling frequency, into an analog waveform; and a step at which a band-pass filter passes only a prescribed alias out of an alias group whose frequency is higher than the Nyquist frequency, contained in said analog waveform, wherein:

said prescribed alias having passed said band-pass filter is transmitted from said RF coil as an RF pulse.

16. The RF pulse generating method according to claim 15, comprising:

an envelope shape generating step of generating a prescribed envelope shape;

an envelope shape correcting step of correcting said envelope shape with the value of a sinc function in the frequency of said RF pulse; and an inverse Fourier transform step of subjecting the corrected envelope shape to inverse Fourier transform and outputting the digital value of the waveform of said fundamental wave.

17. The RF pulse generating method according to claim 16, wherein:

the center frequency of said RF pulse is a frequency resulting from the subtraction of the center frequency of said fundamental wave from a frequency resulting from the multiplication of said sampling frequency by n (n is a natural number); and said envelope shape is identical with a shape resulting from a reversal between the low frequency side and the high frequency side of the RF pulse.

18. The RF pulse generating method according to claim 16, wherein:

the center frequency of said RF pulse is a frequency resulting from the addition of the center frequency of said fundamental wave to a frequency resulting from the multiplication of said sampling frequency by n (n is a natural number); and said envelope shape is identical with the shape of the RF pulse.

19. The RF pulse generating method according to claim 15, further comprising generating an image using the RF pulses.

20. The RF pulse generating method according to claim 15, further comprising switching a frequency of the RF pulses under a high magnetostatic intensity.

* * * * *